United States Patent
Chua (10) Patent No.: US 7,816,750 B2
(45) Date of Patent: Oct. 19, 2010

(54) THIN SEMICONDUCTOR DIE PACKAGES AND ASSOCIATED SYSTEMS AND METHODS

(75) Inventor: Swee Kwang Chua, Singapore (SG)

(73) Assignee: Aptina Imaging Corporation, Grand Cayman (KY)

( * ) Notice: Subject to any disclaimer, the term of this patent is extended or adjusted under 35 U.S.C. 154(b) by 273 days.

(21) Appl. No.: 11/861,143

(22) Filed: Sep. 25, 2007

(65) Prior Publication Data

US 2009/0026593 A1    Jan. 29, 2009

(30) Foreign Application Priority Data

Jul. 24, 2007    (SG) .............................. 200705421-6

(51) Int. Cl.
*H01L 31/0203* (2006.01)
*H01L 23/12* (2006.01)
*H01L 21/00* (2006.01)

(52) U.S. Cl. ........................ 257/433; 257/434; 257/704; 438/64

(58) Field of Classification Search ................. 257/433, 257/434, 704; 438/64
See application file for complete search history.

(56) References Cited

U.S. PATENT DOCUMENTS

| 4,766,095 | A | 8/1988 | Hiroshi |
| 5,145,099 | A | 9/1992 | Wood et al. |
| 5,529,959 | A | * 6/1996 | Yamanaka .................... 438/64 |
| 5,674,785 | A | 10/1997 | Akram et al. |
| 5,677,566 | A | 10/1997 | King et al. |
| 5,804,004 | A | 9/1998 | Tuckerman et al. |
| 5,826,628 | A | 10/1998 | Hamilton |
| 5,879,965 | A | 3/1999 | Jiang et al. |
| 5,986,209 | A | 11/1999 | Tandy |
| RE36,469 | E | 12/1999 | Wood et al. |
| 6,048,744 | A | 4/2000 | Corisis et al. |
| 6,103,547 | A | 8/2000 | Corisis et al. |
| 6,130,474 | A | 10/2000 | Corisis |
| 6,133,068 | A | 10/2000 | Kinsman |
| 6,133,622 | A | 10/2000 | Corisis et al. |

(Continued)

FOREIGN PATENT DOCUMENTS

CN    1753174 A    3/2006

(Continued)

OTHER PUBLICATIONS

Search Report and Written Opinion issued Mar. 9, 2009 in Singapore Application No. 200705421-6.

(Continued)

*Primary Examiner*—Luan C Thai
(74) *Attorney, Agent, or Firm*—Kramer Levin Naftalis & Frankel LLP (57) ABSTRACT

Thin semiconductor die packages and associated systems and methods are disclosed. A package in accordance with a particular embodiment includes a semiconductor die having die bond sites, a conductive structure positioned proximate to the semiconductor die and having first bond sites and second bond sites spaced apart from the first bond sites, and conductive couplers connected between the first bond sites of the conductive structure and the die bond sites of the semiconductor die. A cover can be positioned adjacent to the semiconductor die, and can include a recess in which the conductive couplers are received.

15 Claims, 6 Drawing Sheets

U.S. PATENT DOCUMENTS

| | | | |
|---|---|---|---|
| 6,148,509 A | 11/2000 | Schoenfeld et al. | |
| 6,150,710 A | 11/2000 | Corisis | |
| 6,153,924 A | 11/2000 | Kinsman | |
| 6,159,764 A | 12/2000 | Kinsman et al. | |
| 6,225,689 B1 | 5/2001 | Moden et al. | |
| 6,228,548 B1 | 5/2001 | King et al. | |
| 6,229,202 B1 | 5/2001 | Corisis | |
| 6,239,489 B1 | 5/2001 | Jiang | |
| 6,246,108 B1 | 6/2001 | Corisis et al. | |
| 6,246,110 B1 | 6/2001 | Kinsman et al. | |
| 6,258,623 B1 | 7/2001 | Moden et al. | |
| 6,258,624 B1 | 7/2001 | Corisis | |
| 6,261,865 B1 | 7/2001 | Akram | |
| 6,271,580 B1 | 8/2001 | Corisis | |
| 6,284,571 B1 | 9/2001 | Corisis et al. | |
| 6,291,894 B1 | 9/2001 | Farnworth et al. | |
| 6,297,547 B1 | 10/2001 | Akram | |
| 6,303,981 B1 | 10/2001 | Moden | |
| 6,303,985 B1 | 10/2001 | Larson et al. | |
| 6,310,390 B1 | 10/2001 | Moden | |
| 6,329,705 B1 | 12/2001 | Ahmad | |
| 6,331,448 B1 | 12/2001 | Ahmad | |
| 6,344,976 B1 | 2/2002 | Schoenfeld et al. | |
| 6,472,247 B1 * | 10/2002 | Andoh et al. | 438/64 |
| 6,472,729 B1 | 10/2002 | Oka | |
| 6,545,332 B2 | 4/2003 | Huang | |
| 6,548,757 B1 | 4/2003 | Russell et al. | |
| 6,576,494 B1 | 6/2003 | Farnworth | |
| 6,603,072 B1 | 8/2003 | Foster et al. | |
| 6,649,991 B1 * | 11/2003 | Chen et al. | 257/433 |
| 6,667,543 B1 | 12/2003 | Chow et al. | |
| 6,740,870 B1 | 5/2004 | Doudoumopoulos | |
| 6,781,243 B1 | 8/2004 | Li et al. | |
| 6,882,021 B2 | 4/2005 | Boon et al. | |
| 6,969,898 B1 | 11/2005 | Exposito et al. | |
| 7,002,241 B1 | 2/2006 | Mostafazadeh et al. | |
| 7,064,006 B2 | 6/2006 | Akram | |
| 7,074,651 B2 | 7/2006 | Lien | |
| 7,112,864 B2 * | 9/2006 | Tsukamoto et al. | 257/433 |
| 7,117,236 B2 * | 10/2006 | Guo et al. | 708/401 |
| 7,132,753 B1 | 11/2006 | St. Amand et al. | |
| 7,154,053 B2 * | 12/2006 | Hsu | 174/564 |
| 7,171,745 B2 | 2/2007 | Mostafazadeh et al. | |
| 7,179,740 B1 | 2/2007 | Hsuan | |
| 7,218,001 B2 | 5/2007 | Seng | |
| 2001/0000631 A1 | 5/2001 | Zandman et al. | |
| 2003/0062606 A1 | 4/2003 | Chun et al. | |
| 2003/0071332 A1 | 4/2003 | Hsu et al. | |
| 2003/0155693 A1 | 8/2003 | Farnworth et al. | |
| 2004/0140546 A1 | 7/2004 | Lee et al. | |
| 2004/0164981 A1 * | 8/2004 | Fujita et al. | 345/418 |
| 2004/0207055 A1 | 10/2004 | Iwasa | |
| 2005/0003583 A1 | 1/2005 | Keating | |
| 2005/0230803 A1 | 10/2005 | Liu | |
| 2006/0003483 A1 | 1/2006 | Wolff et al. | |
| 2006/0063283 A1 | 3/2006 | Cobbley et al. | |
| 2006/0076690 A1 | 4/2006 | Khandros et al. | |
| 2006/0087013 A1 | 4/2006 | Hsieh | |
| 2006/0180903 A1 | 8/2006 | Takeda et al. | |
| 2006/0226528 A1 | 10/2006 | Kwon | |
| 2006/0231937 A1 | 10/2006 | Juskey et al. | |
| 2006/0270112 A1 | 11/2006 | Chao et al. | |
| 2007/0001708 A1 | 1/2007 | Bertin et al. | |
| 2007/0007517 A1 | 1/2007 | Brooks et al. | |
| 2007/0011866 A1 | 1/2007 | Lee et al. | |
| 2007/0045806 A1 | 3/2007 | Hsuan | |
| 2007/0052077 A1 | 3/2007 | Wathanawasam et al. | |
| 2007/0059984 A1 | 3/2007 | Farnworth et al. | |
| 2007/0085195 A1 | 4/2007 | Lee et al. | |
| 2007/0090517 A1 | 4/2007 | Moon et al. | |
| 2007/0096266 A1 | 5/2007 | Yu et al. | |
| 2007/0096268 A1 | 5/2007 | Sharma et al. | |
| 2007/0102803 A1 | 5/2007 | Gann | |
| 2007/0126081 A1 | 6/2007 | Webster et al. | |
| 2008/0023808 A1 * | 1/2008 | Wu et al. | 257/678 |

FOREIGN PATENT DOCUMENTS

| | | |
|---|---|---|
| CN | 1845324 | 10/2006 |
| DE | 202005019706 | 3/2006 |
| EP | 0669650 A2 | 8/1995 |
| EP | 1 724 835 A1 | 11/2006 |
| JP | 61-214565 A | 9/1986 |
| JP | 05251619 A | 9/1993 |
| JP | 05299444 A | 11/1993 |
| JP | 2000012741 A | 1/2000 |
| JP | 2000091490 A | 3/2000 |
| JP | 2006237358 | 9/2006 |
| JP | 2006-319302 A | 11/2006 |
| KR | 20010055256 | 7/2001 |
| KR | 2003-0001032 A | 1/2003 |
| KR | 2003-0083445 A | 10/2003 |
| KR | 2004-0031995 A | 4/2004 |
| TW | 236718 B | 7/2005 |
| TW | 248176 B | 1/2006 |
| TW | 251887 B | 3/2006 |
| TW | 254998 B | 5/2006 |
| TW | 260748 B | 8/2006 |
| WO | WO 2006/022591 A1 | 3/2006 |
| WO | WO 2006/101577 A2 | 9/2006 |
| WO | WO-2006/124597 A2 | 11/2006 |
| WO | WO 2007/027399 A1 | 3/2007 |

OTHER PUBLICATIONS

Longford, A. et al., "The Use of Pre-Molded Leadframe Cavity Package Technologies in Photonic and RF Applications," pp. 348-352, SEMICON West 2002, SEMI Technology Symposium: International Electronics Manufacturing Technology (IEMT) Symposium, IEEE 2002.

Robinson, S.D. et al., "Low-Cost Molded Packaging for Optical Data Links," IEEE Transactions on Components, Packaging, and Manufacturing Technology—Part B, vol. 18, No. 2, pp. 235-240, May 1995.

St. Louis, J. et al., "Low Cost Chip Carriers for the 1980's," IEEE Transactions on Components, Hybrids, and Manufacturing Technology, vol. CHMT-4, No. 2, pp. 205-209, Jun. 1981.

U.S. Appl. No. 11/861,094, Chua et al.

Karnezos, M., "3-D Packaging: Where All Technologies Come Together," Electronics Manufacturing Technology Symposium, 2004, IEEE/CPMT/SEMI 29th International, Jul. 14-16, 2004, pp. 64-67.

Ko, H.S. et al., "Development of Three-Dimensional Memory Die Stack Packages Using Polymer Insulated Sidewall Technique," IEEE Transactions on Advanced Packaging, vol. 23, No. 2, pp. 252-256, May 2000.

Poh, Francis KS et al., "Development of High Power QFN Package," Electronics Manufacturing Technology Symposium, 2004, IEEE/CPMT/SEMI International, Jul. 14-16, 2004, pp. 295-300.

Song, S.N., "Die Attach Film Application in Multi Die Stack Package," Proceedings of 7th Electronic Packaging Technology Conference, 2005, vol. 2, pp. 848-852, Dec. 2005.

Wu, L. et al., "Innovative Stack-Die Package-S2BGA," Proceedings of 52nd Electronic Components and Technology Conference, IEEE, 2002, pp. 250-253.

International Search Report and Written Opinion for International Application No. PCT/US2008/070165, Oct. 16, 2008.

* cited by examiner

THIN SEMICONDUCTOR DIE PACKAGES AND ASSOCIATED SYSTEMS AND METHODS

CROSS-REFERENCE TO RELATED APPLICATION

This application claims foreign priority benefits of Singapore Application No. 200705421-6 filed Jul. 24, 2007, which is incorporated herein by reference in its entirety.

TECHNICAL FIELD

The present disclosure is directed generally to thin semiconductor die packages and associated systems and methods, including packages with covers having recesses that receive wirebonds or other conductive couplers, and packages formed with temporary support members.

BACKGROUND

Packaged semiconductor dies, including memory chips, microprocessor chips, and imager chips, typically include a semiconductor die mounted to a substrate and encased in a plastic protective covering. The die includes functional features, such as memory cells, processor circuits, imager devices, and interconnecting circuitry. The die also typically includes bond pads electrically coupled to the functional features. The bond pads are electrically connected to pins or other types of terminals that extend outside the protective covering for connecting the die to busses, circuits, and/or other microelectronic assemblies.

In one conventional arrangement, the die is mounted to a supporting substrate (e.g., a printed circuit board), and the die bond pads are electrically coupled to corresponding bond pads of the substrate with wirebonds. After encapsulation, the substrate can be electrically connected to external devices with solder balls or other suitable connections. Accordingly, the substrate both supports the die and provides an electrical link between the die and the external devices.

In other conventional arrangements, the die can be mounted to a leadframe that has conductive leadfingers connected to a removable frame. The frame temporarily supports the leadfingers in position relative to the die during manufacture. Each leadfinger is wirebonded to a corresponding bond pad of the die, and the assembly is encapsulated in such a way that the frame and a portion of each of the leadfingers extends outside the encapsulating material. The frame is then trimmed off, and the exposed portions of each leadfinger can be used to provide connections between the die and external devices.

Figure 1A:
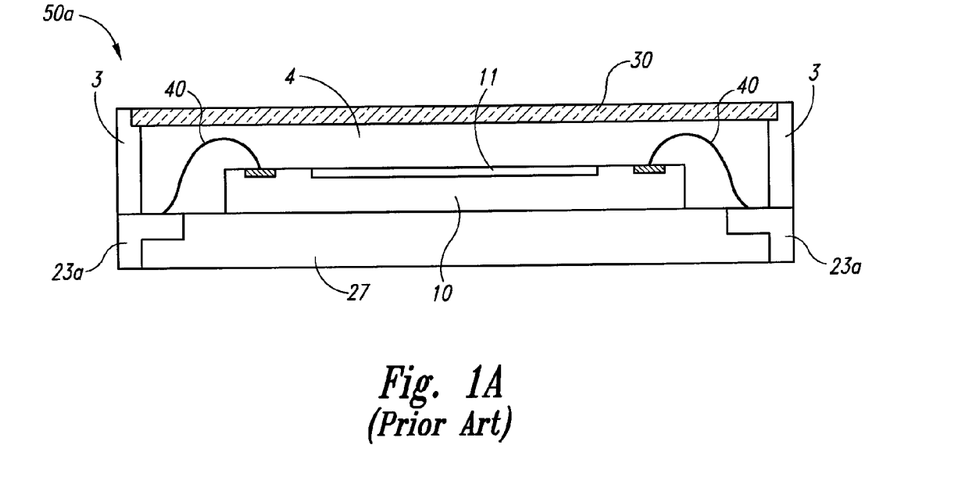
FIGS. 1A-1B are partially schematic, cross-sectional illustrations of packages configured in accordance with the prior art.
Figure 1B:
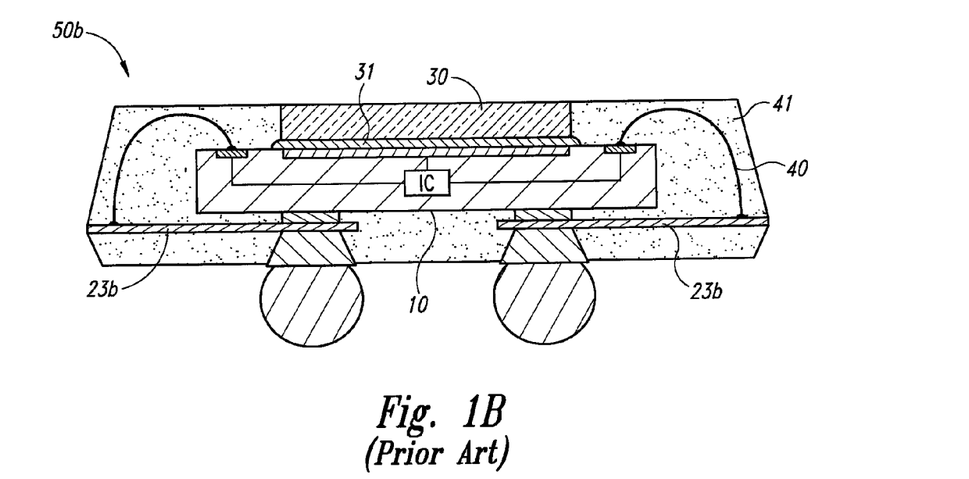

FIG. 1A is a partially schematic, cross-sectional illustration of a package 50a configured in accordance with the prior art. The package 50a includes a die 10 that has an upwardly facing imager 11 and is supported from below by an insulating (e.g., ceramic) base 27. Leadfingers 23a are positioned around all four sides of the die 10 in a "quad flat no lead" (QFN) configuration, and are connected to the die 10 with wirebonds 40. Insulating standoffs 3 form a cavity 4 in which the die 10 is positioned, and support a glass window 30 over the imager 11. The window 30 provides a hermetically sealed package that transmits visible light to the imager 11. FIG. 1B illustrates another package 50b configured in accordance with the prior art. In this arrangement, the die 10 is carried by leads 23b. The glass window 30 is attached to the die 10 with an adhesive 31, and an encapsulant 41 is disposed over a portion of the die 10, the leads 23b, and the wirebonds 40 to protect these components.

Both arrangements for the packages 50a, 50b are suitable for installations in digital cameras, sensors, and/or other such devices. While the arrangements shown in FIG. 1A-1B have proven suitable for many applications, there remains a need to still further reduce the size of the package and the costs associated with manufacturing the package.

DETAILED DESCRIPTION

Several embodiments of the present disclosure are described below with reference to packaged semiconductor devices and assemblies, and methods for forming packaged semiconductor devices and assemblies. Many details of certain embodiments are described below with reference to semiconductor dies. The term "semiconductor die" is used throughout to include a variety of articles of manufacture, including, for example, individual integrated circuit dies, imager dies, sensor dies, and/or dies having other semiconductor features. Many specific details of certain embodiments are set forth in FIGS. 2-8 and the following text to provide a through understanding of these embodiments. Several other embodiments can have different configurations, components, and/or processes than those described in this disclosure. A person skilled in the relevant art, therefore, will appreciate that additional embodiments may be practiced without several details of the embodiments shown in FIGS. 2-8, and/or with additional details and/or features.

Figure 2:
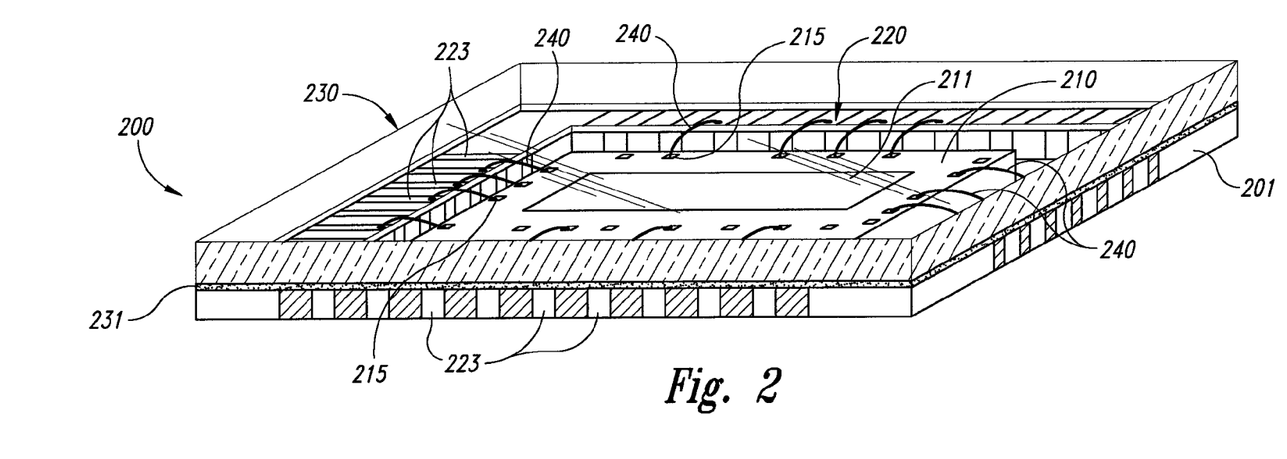
FIG. 2 is a partially schematic, isometric illustration of a system that includes a package having a cover configured in accordance with an embodiment of the disclosure.

FIG. 2 is a partially schematic, isometric illustration of a system 200 that includes a semiconductor package 201 configured in accordance with an embodiment of the disclosure. The semiconductor package 201 can include a semiconductor die 210 having a sensor and/or transmitter (referred to as a sensor/transmitter 211) that receives and/or transmits radiation. For example, the sensor/transmitter 211 can include an imager device suitable for use in digital cameras, cell phones, and other applications. A conductive structure 220 can be positioned proximate to the semiconductor die 210 to transmit signals to and from the semiconductor die 210. In a particular embodiment, the conductive structure 220 includes leadfingers 223 positioned around a periphery of the semiconductor die 210. Conductive couplers 240 (e.g., wirebonds) can be connected between the leadfingers 223 and corresponding die bond sites 215 of the semiconductor die 210. A cover 230 is positioned adjacent to the semiconductor die 210 and the conductive structure 220, and can be secured to the semiconductor die 210 and the conductive structure 220 with an adhesive 231. The cover 230 can be transparent or at least partially transparent to radiation that is received or transmitted by the sensor/transmitter 211. Accordingly, the cover 230 can protect the components within the package 201, while providing little or no interference with the operation of the sensor/transmitter 211.

Figure 3:
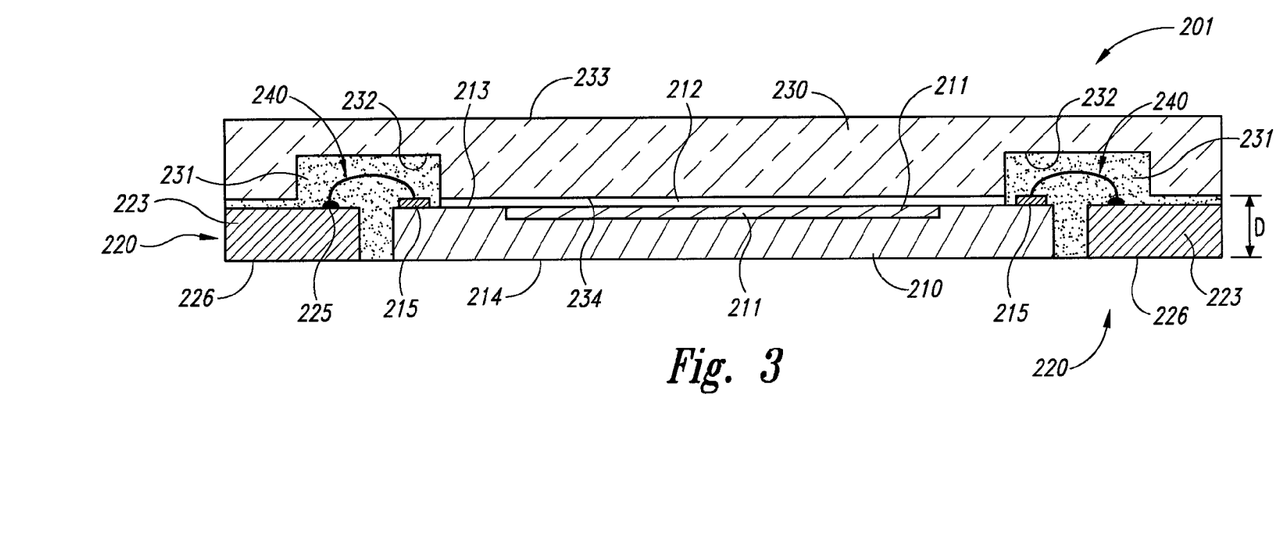
FIG. 3 is a partially schematic, cross-sectional illustration of an embodiment of the package shown in FIG. 2.

FIG. 3 is a partially schematic, cross-sectional illustration of an embodiment of the semiconductor package 201 shown in FIG. 2. As shown in FIG. 3, the semiconductor die 210 can have a first (e.g., upwardly facing) surface 213 and a second (e.g., downwardly facing) surface 214. The sensor/transmitter 211 can be located at the first surface 213, which can also carry the die bond sites 215 for transmitting electrical signals to and from the semiconductor die 210. The adjacent leadfingers 223 of the conductive structure 220 can include first bond sites 225 positioned adjacent to the die bond sites 215, and second bond sites 226 that are accessible from a region outside the semiconductor package 201. In an embodiment shown in FIG. 3, the conductive couplers 240 connected between the die bond sites 215 and the first bond sites 225 include wirebonds. In other embodiments, the conductive couplers 240 can include other suitable structures. In any of these embodiments, the conductive couplers 240 may project outwardly (e.g., in an upward direction in FIG. 3) from the first bondsite 225, the die bondsite 215, and/or the first surface 213 of the semiconductor die 210.

The cover 230 is positioned adjacent to the semiconductor die 210 and can include a first (e.g., outwardly facing) surface 233 and a second (e.g., inwardly facing) surface 234. The second surface 234 can include a recess 232 that receives at least a portion of individual conductive couplers 240. Accordingly, a distance D between the second surface 214 of the semiconductor die 210 and the first surface 233 of the cover 230 can be reduced when compared to existing arrangements (including, for example, the arrangement shown in FIG. 1A) because the cover 230 need not be offset from the semiconductor die 210 by an amount necessary to accommodate the outwardly projecting conductive couplers 240. The cover 230 may be offset from the semiconductor die 210 by a small amount to produce the gap 212, e.g., when the sensor/transmitter 211 carried by the semiconductor die 210 requires and/or benefits from such a gap. In other embodiments, the gap 212 can be eliminated, as will be described in greater detail later with reference to FIG. 6A. In any of these embodiments, the presence of the recess 232 in a location that at least partially receives or accommodates the conductive couplers 240 can reduce the overall thickness of the semiconductor package 201.

Figure 4A:
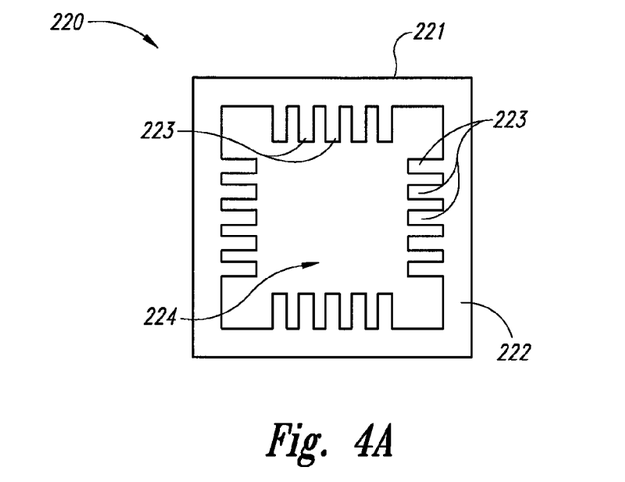
FIG. 4A is a partially schematic, top plan view of a conductive structure configured in accordance with an embodiment of the disclosure.
Figure 4B:
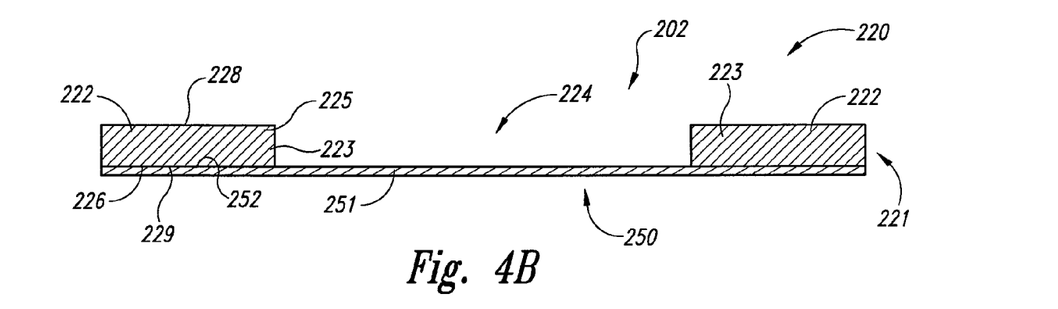
FIG. 4B illustrates a conductive structure connected to a removable support member in accordance with an embodiment of the disclosure.

FIGS. 4A-4B illustrate steps in a process for manufacturing the semiconductor package 201 shown in FIGS. 2 and 3, in accordance with a particular embodiment of the disclosure. FIG. 4A illustrates a conductive structure 220 suitable for conveying electrical signals to and from the package 201. In a particular embodiment, the conductive structure 220 includes a leadframe 221 that in turn includes leadfingers 223 connected to a sacrificial frame member 222. The frame member 222 and the leadfingers 223 are positioned around an opening 224 through which the bond sites of a corresponding semiconductor die are accessible, as is described in further detail below with reference to FIGS. 4B and 4C.

FIG. 4B is a partially schematic, cross-sectional illustration of the conductive structure 220 shown in FIG. 4A, with a removable support member 250 attached. The conductive structure 220 can include a first surface 228 carrying the first bond sites 225, and a second surface 229 carrying the second bond sites 226. When the conductive structure 220 includes a leadframe 221, the removable support member 250 can be attached to the frame member 222 and/or the leadfingers 223 at the second surface 229. Accordingly, the removable support member 250 temporarily closes one end of the opening 224 through the conductive structure 220. In a particular embodiment, the removable support member 250 includes a film 251 carrying a temporary adhesive 252 that is attached to the second surface 229 of the conductive structure 220. For example, the removable support member 250 can include a pressure-sensitive, high temperature tape suitable for undergoing subsequent processes (e.g., wirebonding processes) at elevated temperatures. The resulting assembly 202 formed by the conductive structure 220 and the removable support member 250 then receives the semiconductor die 210, as described below with reference to FIG. 4C.

Figure 4C:
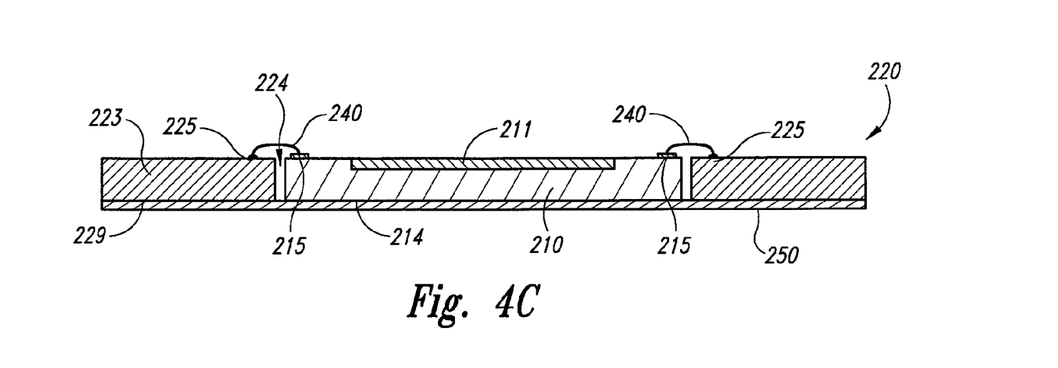
FIG. 4C illustrates the arrangement shown in FIG. 4B, with a semiconductor die attached to the removable support member in accordance with an embodiment of the disclosure.

As shown in FIG. 4C, the semiconductor die 210 is positioned in the opening 224 so that the second surface 214 of the semiconductor die 210 is placed against and temporarily held by the removable support member 250. Accordingly, the second surface 229 of the conductive structure 220 can be coplanar with the second surface 214 of the semiconductor die 210. With the semiconductor die 210 temporarily secured in position relative to the conductive structure 220, the conductive couplers 240 can be connected between the first bond sites 225 of the leadfingers 223 and the die bond sites 215 of the semiconductor die 210.

Figure 5:
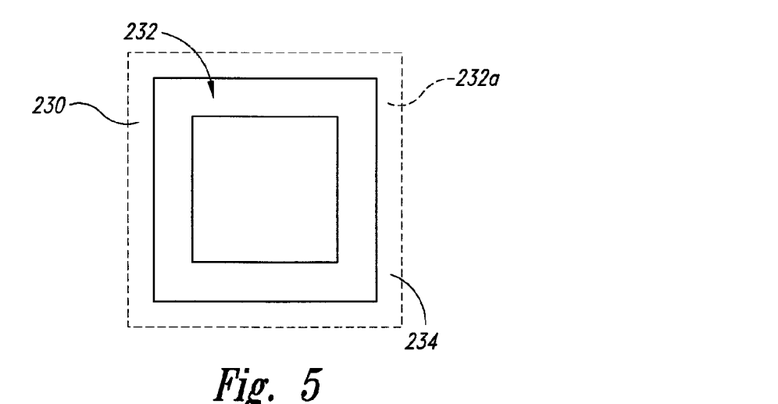
FIG. 5 is a partially schematic, top plan view of a cover having a recess configured in accordance with an embodiment of the disclosure.

FIG. 5 is a bottom plan view of a cover 230 configured in accordance with an embodiment of the disclosure. The cover 230 can be manufactured from a material that is transparent, or at least partially transparent, to radiation at a target wavelength that is received or transmitted by the sensor/transmitter 211 (FIG. 4C). For example, in a particular embodiment in which the sensor/transmitter 211 includes an imager configured to receive and process radiation in the visible spectrum, the cover 230 can be made from glass. In other embodiments, the cover 230 can have other compositions, depending upon factors that include, but are not limited to, the particular characteristics of the sensor/transmitter 211. In any of these embodiments, the cover 230 can be generally rigid and self-supporting, and can include a recess 232 positioned in the second surface 234. The recess 232 can be pre-formed in the cover 230 before the cover 230 is joined to the rest of the assembly. In an arrangement shown in FIG. 5, the recess 232 has the general form of a channel located within the outer periphery of the cover 230 and having a generally rectangular cross-sectional shape. Accordingly, the recess 232 can receive conductive couplers that are arranged around all four sides of a corresponding semiconductor die. When the semiconductor die has different arrangements, for example, two rows of bond sites at opposing edges of the die, or bond sites disposed along a single row at the center of the die, the recess 232 can have other corresponding locations. The recess 232 can also have cross-sectional shapes other than the rectangular shape shown in FIG. 5, e.g., a half-round shape, a trapezoidal shape, or others.

The recess 232 can be formed by any of a variety of suitable techniques. For example, the recess 232 can be formed using a laser or a wet etch process. In other embodiments, the recess 232 can be formed with a blade, e.g., a singulation blade. For example, a dicing blade may be particularly suitable for forming a recess 232a that extends all the way to the outer edge of the cover 230, as indicated by dashed lines in FIG. 5. In still another embodiment, the recess 232 can be molded directly into the cover 230 when the cover 230 is formed. In any of these embodiments, the cover 230 can have a thickness of from about 0.3 millimeters to about 1.5 millimeters, and the recess 232 an have a depth of about 100 microns or less. The foregoing representative dimensions can have other values in other embodiments. Multiple covers 230 with corresponding recesses 232 can be formed from a single piece of stock (e.g., a glass wafer), and then individual covers 230 can be singulated from the stock prior to being attached to a die. Representative embodiments for attaching the cover 230 to a die are described below with reference to FIGS. 6A-6B.

Figure 6A:
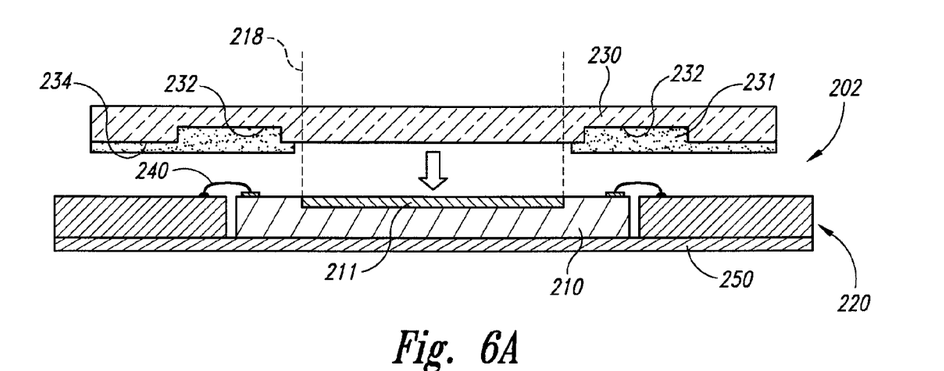
FIG. 6A is a partially schematic, cross-sectional side view of a cover positioned to be attached to a semiconductor die in accordance with an embodiment of the disclosure.

FIG. 6A illustrates the cover 230 positioned proximate to the assembly 202 of the semiconductor die 210 and the conductive structure 220 described previously with reference to FIG. 4C. In a particular aspect of this embodiment, the cover 230 includes an adhesive 231 that is pre-disposed in the recess 232. The adhesive 231 can include any of a variety of suitable materials, for example, a UV-curable epoxy material. The adhesive 231 can have a viscosity high enough to allow it to adhere to the second surface 234 and the recess 232 of the cover 230 when the cover 230 is inverted (as shown in FIG. 6A) e.g., by a pick-and-place apparatus. The cover 230 can then be moved downwardly to the assembly 202 below, with the adhesive 231 contacting the conductive structure 220 and/or the semiconductor die 210. Optionally, the assembly 202 may be placed under pressure to enhance the seal between the cover 230, the semiconductor die 210 and/or the conductive structure 220. The adhesive 231 can optionally be cured e.g., by exposure to UV radiation.

In a particular embodiment, the adhesive 231 is not optically transparent. Accordingly, the adhesive 231 is placed on the cover 230 in such a manner that, when it contacts the assembly 202, it does not extend inwardly into a radiation path 218 along which the sensor/transmitter 211 receives and/or transmits radiation signals. For example, the adhesive 231 can be applied using a stencil and/or printing technique. In other embodiments, the adhesive 231 can be transparent at the wavelength associated with the sensor/transmitter, e.g., the adhesive 231 can be an optical-grade adhesive. In such an instance, the adhesive 231 can optionally be disposed over the inner portion of the cover 230, as it will not interfere with the operation of the sensor/transmitter 211. Suitable adhesives for both of the foregoing applications are available from the Abelstik Company of Rancho Dominguez, Calif.

Figure 6B:
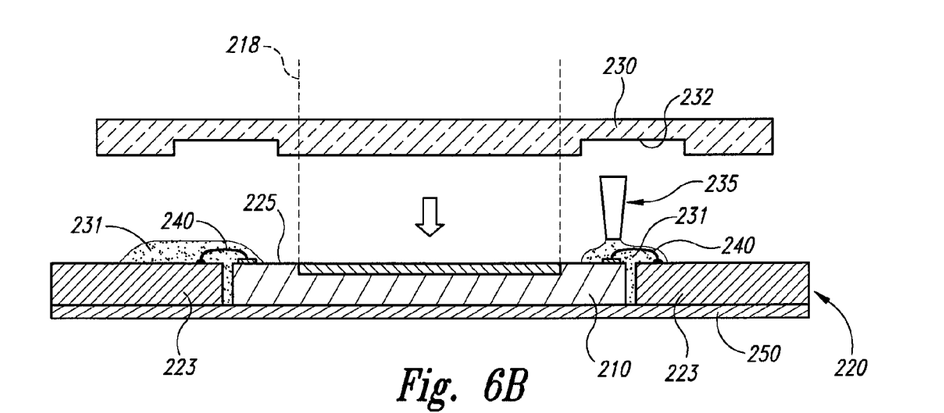
FIG. 6B is a partially schematic, cross-sectional side view of a cover positioned to be attached to a semiconductor die in accordance with another embodiment of the disclosure.

FIG. 6B illustrates another arrangement for attaching the cover 230 to the assembly 202, which may be used in lieu of the arrangement described above with reference to FIG. 6A. In this embodiment, an adhesive dispenser 235 applies the adhesive 231 to the semiconductor die 210 and/or the conductive structure 220, instead of applying the adhesive 231 directly to the cover 230, as was discussed above with reference FIG. 6A. The adhesive 231 can be disposed in a manner that covers the conductive couplers 240 and extends into a gap between the ends of the leadfingers 223 and the semiconductor die 210. In a particular embodiment, the amount of adhesive 231 disposed in this manner is controlled by the dispenser 235 so that when the cover 230 is placed downwardly on the assembly 202 and contacts the adhesive 231, it does not cause an excess amount of adhesive 231 to flow or otherwise move inwardly and interfere with the radiation path 218 associated with the sensor/transmitter 211. The adhesive 231 accordingly covers less than the entire first surface 225 of the semiconductor die 210 and may be cured in a manner similar to that described above with reference to FIG. 6A. In another embodiment, e.g., when the adhesive 231 is of optical grade, or is otherwise transparent at the desired wavelength, the adhesive 231 can be disposed over the sensor/transmitter 211.

Figure 7A:
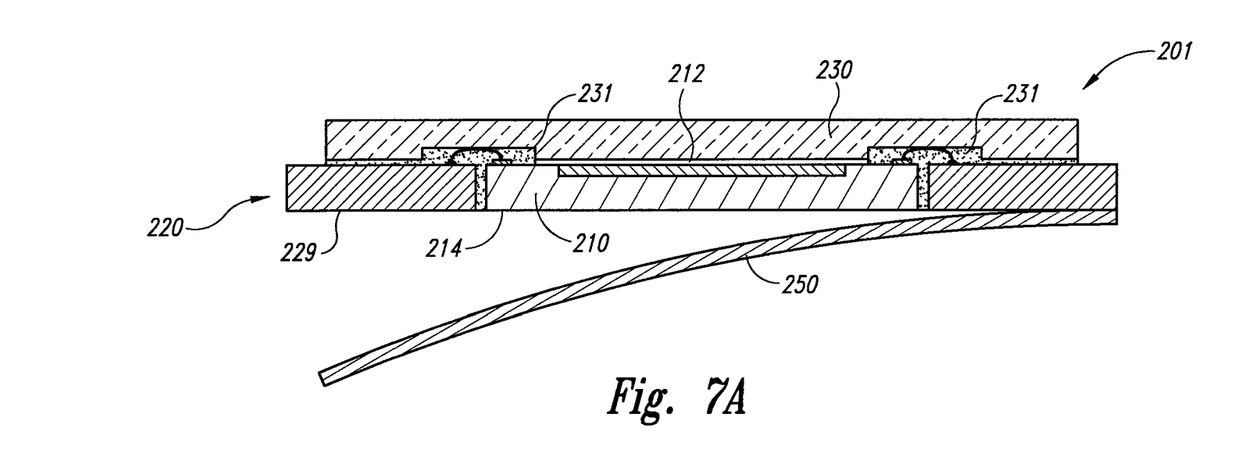
FIG. 7A illustrates a process for removing a releasable support member from a die and a conductive structure in accordance with an embodiment of the disclosure.

FIG. 7A illustrates the package 201 after the cover 230 has been attached. If the adhesive 231 is confined to the peripheral region of the semiconductor die 210, the package 201 includes a gap 212 between the cover 230 and the sensor/transmitter 211. In other embodiments, the adhesive 231 can cover the sensor/transmitter 211 and the gap 212 can be eliminated. Once the adhesive 231 has been attached, the removable support member 250 may be removed from the second surface 214 of the semiconductor die 210 and the second surface 229 of the conductive structure 220, e.g., by peeling the support member 250 away. Optionally, the adhesive 231 can be further cured (e.g., at elevated temperatures) after the support member 250 has been removed.

Figure 7B:
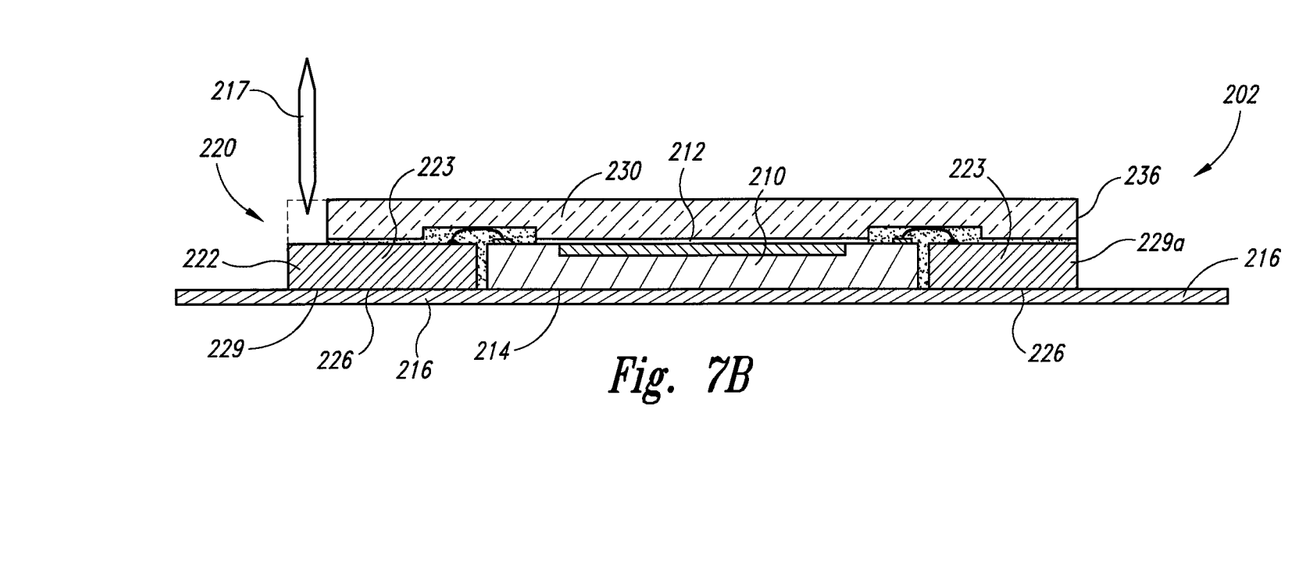
FIG. 7B illustrates a process for removing portions of a conductive structure and (optionally) a cover in accordance with multiple embodiments of the disclosure.

In FIG. 7B, the assembly 202 is placed on a singulation tape 216 or other substrate suitable for supporting the assembly 202 during a singulation process. During the singulation process, a blade 217 or other singulation device (e.g., a water jet or a laser beam) is used to separate the frame member 222 from the inwardly disposed leadfingers 223. In a particular embodiment, the outer edges of the cover 230 are at or within the outer edges of the leadfingers 223 and accordingly, the blade 217 need only separate the frame member 222 from the leadfingers 223. In another embodiment, the cover 230 may overlie at least portion of the frame member 222, as shown in dashed lines in FIG. 7B. Accordingly, the blade 217 or other singulation device can cut through both the frame member 222 and the outer portions of the cover 230. In either embodiment, the outer edges 236 of the cover 230 can be exposed after the singulation process is complete. The singulation tape 216 is then removed to expose the second surface 214 of the semiconductor die 210 and the second bond sites 226 positioned at the second surface 229 of the conductive structure 220. Accordingly, the leadfingers 223 can be accessed from the second surface 229 of the conductive structure 220 and also from the outwardly facing edge surfaces 229a of the conductive structure 220.

One feature of semiconductor packages in accordance with at least some of the foregoing embodiments described above is that they can include a cover having a recess that receives the conductive couplers connected between the semiconductor die and the conductive structure. As a result, the conductive couplers, or portions of the conductive couplers, can be accommodated in the recess, and the overall thickness of the package when the cover is included can be less than the overall thickness of the package if the cover did not include the recess. This arrangement can make the package more versatile and, in particular embodiments, better suited for compact electronic devices in which space is at a premium.

Another feature of packages in accordance with at least some of the foregoing embodiments is that they can be manufactured with the aid of a removable or releasable support member that supports the conductive structure and the die relative to each other as these components are connected, but is then removed prior to completing the package. As a result, the package does not require a base (e.g., the base 27 shown in FIG. 1A), which is typically encapsulated as part of the overall package. Accordingly the overall thickness of the package can be reduced. Another result of this feature is that the second surface of the semiconductor die can be exposed, which can improve the rate at which heat is transferred away from the semiconductor die. At the same time, the semiconductor package can include a high density of low profile external connectors (e.g., arranged in a "quad flat no lead" or QFN configuration) so as to provide for an improved integratibility with electronic devices.

Still another feature of semiconductor packages in accordance with at least some of the foregoing embodiments is that they do not include an encapsulant (e.g., the encapsulant 41 shown in FIG. 1B). Instead, the packages can include an adhesive that connects the cover to the semiconductor die, but does not encapsulate the entire assembly. For example, the outer edges of the cover can be exposed. Because encapsulants are typically disposed in a high temperature process, eliminating the encapsulant and replacing it with an adhesive that has a lower temperature curing process can reduce the thermal stresses placed on the semiconductor die during processing, and can accordingly use less of the "thermal budget" allocated to the semiconductor die for manufacturing processes. This in turn can improve the reliability of the package, and/or allow other, perhaps more critical processes to be conducted at higher temperatures.

Figure 8:
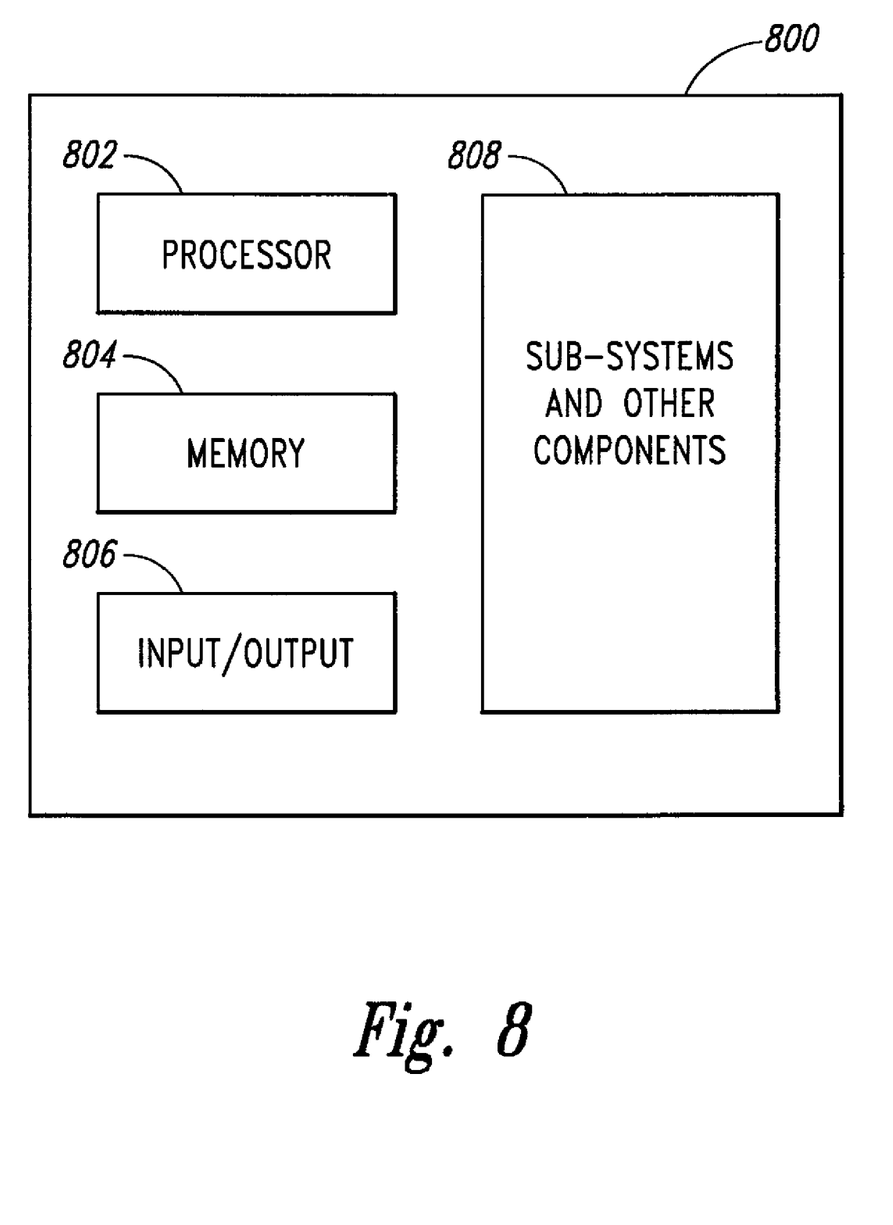
FIG. 8 is a schematic illustration of a system that can include one or more packages configured in accordance with several embodiments of the disclosure.

Any of the semiconductor packages described above with reference to FIGS. 2-7B can be incorporated into a myriad of larger and/or complex systems, a representative example of which is a system 800 shown schematically in FIG. 8. The system 800 can include a processor 802, a memory 804 (e.g., SRAM, DRAM, flash memory and/or other memory device), input/output devices 806 (e.g., a sensor and/or a transmitter), and/or other sub-systems or components 808. Semiconductor packages having any one or a combination the features described above with reference to FIG. 2-7B may be included in any of the devices shown in FIG. 8. The resulting system 800 can perform any of a wide variety of computing, processing, storage, sensing, imaging, and/or other functions. Accordingly, the representative system 800 includes without limitation, computers and/or other data processors, for example, desktop computers, laptop computers, internet appliances, hand-held devices (e.g., palm-top computers, wearable computers, cellular or mobile phones, personal digital assistants, music players, cameras, etc.), multi-processor systems, processor-based or programmable consumer electronics, network computers and minicomputers. Other representative systems 800 may be housed in a single unit or distributed over multiple interconnected units (e.g., through a communication network). The components of the system 800 can accordingly include local and/or remote memory storage devices, and any of a wide variety of computer readable media.

From the foregoing, it will be appreciated that specific embodiments have been described herein for purposes of illustration, but that the foregoing systems and methods may have other embodiments as well. For example, while certain of the embodiments describe above were described in the context of semiconductor packages that include a sensor/transmitter, many of the foregoing features may be included in semiconductor packages that do not include a sensor/transmitter. Certain features described in the context of particular embodiments may be combined or eliminated in other embodiments. Further, while advantages associated with certain embodiments have been described in the context of those embodiments, other embodiments may also exhibit such advantages, and not all embodiments need necessarily exhibit such advantages. Accordingly, the disclosure can include other embodiments not shown or described above.

I claim

1. A semiconductor system, comprising:
    a semiconductor package that includes:
        a semiconductor die having die bond sites;
        a conductive structure positioned proximate to the semiconductor die, the conductive structure having first bond sites and second bond sites spaced apart from the first bond sites;
        conductive couplers connected between the first bond sites and the die bond sites; and
        a cover positioned adjacent to the semiconductor die, the cover comprising a single piece having at least one recess in which the conductive couplers are received, wherein a portion of the cover located between a first and second portion of the at least one recess extends further towards the semiconductor die, and wherein the conductive structure and the semiconductor die each have a first surface facing toward the cover and a second surface facing away from the cover, and wherein the second surface of the conductive structure is generally flush with the second surface of the semiconductor die.

2. The system of claim 1 wherein the semiconductor die includes at least one of a sensor positioned to receive radiation along a radiation path at a target wavelength, and a transmitter positioned to transmit radiation along the radiation path at the target wavelength, and wherein the cover is positioned along the radiation path and is at least generally transparent at the target radiation.

3. The system of claim 2 wherein the cover includes a glass material.

4. The system of claim 1 wherein the at least one recess is a pre-formed recess formed in the cover before the cover is attached to at least one of the semiconductor die and the conductive structure.

5. The system of claim 1 wherein the conductive structure includes conductive leadfingers of a conductive leadframe.

6. The system of claim 1 wherein the conductive couplers include wirebonds.

7. The system of claim 1 wherein the cover has a first surface facing outwardly from the semiconductor die and a second surface facing inwardly toward the semiconductor die, and wherein the at least one recess is in the second surface and has a generally rectangular cross-sectional shape.

8. The system of claim 1 wherein the cover has a first surface facing outwardly from the semiconductor die, a second surface facing inwardly toward the semiconductor die, and a peripheral edge surface between the first and second surfaces, and wherein the edge surface is exposed.

9. The system of claim 1, further comprising an adhesive disposed between the semiconductor die and the cover.

10. The system of claim 9 wherein the adhesive is disposed in the recess and in contact with the conductive coupler, the conductive structure, the first bond sites and the die bond sites.

11. The system of claim 1 wherein the semiconductor package further includes an adhesive between the cover and the semiconductor die, but no encapsulant, and wherein an outwardly facing surface of the cover and the second surface of the semiconductor die face in opposite directions and are both exposed.

12. The system of claim 1 wherein the semiconductor die and the cover are separated by a gap.

13. The system of claim 1 wherein the cover has four edge surfaces, and wherein the at least one recess includes a continuous channel arranged generally parallel to each of the four edge surfaces.

14. The system of claim 1 wherein the die bond sites are located at the first surface of the semiconductor die, and wherein the second surface of the semiconductor die is accessible from outside the package.

15. The system of claim 1, further comprising a computing device having at least one of a processor, a memory and an input/output device, and wherein the semiconductor package is included as a component of at least one of the processor, the memory, and the input/output device.

* * * * *